US012613266B2

(12) United States Patent
Zimmerman et al.

(10) Patent No.: US 12,613,266 B2
(45) Date of Patent: Apr. 28, 2026

(54) VEHICLE KEY-OFF LOAD MONITORING

(71) Applicant: FORD GLOBAL TECHNOLOGIES, LLC, Dearborn, MI (US)

(72) Inventors: Reagan P. Zimmerman, Bloomfield Hills, MI (US); Craig E. Esler, Plymouth, MI (US); Shormin Razzaq Chowdhury, Northville, MI (US)

( * ) Notice: Subject to any disclaimer, the term of this patent is extended or adjusted under 35 U.S.C. 154(b) by 421 days.

(21) Appl. No.: 18/243,261

(22) Filed: Sep. 7, 2023

(65) Prior Publication Data

US 2025/0085326 A1    Mar. 13, 2025

(51) Int. Cl.
| | |
|---|---|
| *G01R 31/00* | (2006.01) |
| *G07C 5/00* | (2006.01) |
| *G07C 5/08* | (2006.01) |

(52) U.S. Cl.
CPC ........... *G01R 31/007* (2013.01); *G07C 5/008* (2013.01); *G07C 5/0816* (2013.01)

(58) Field of Classification Search
CPC ..... G01R 31/007; G07C 5/008; G07C 5/0816
USPC ......................................................... 702/58
See application file for complete search history.

(56) References Cited

U.S. PATENT DOCUMENTS

| | | | | |
|---|---|---|---|---|
| 5,629,680 A * | 5/1997 | Makhija | ............... | G01R 31/006 |
| | | | | 340/636.15 |
| 6,424,157 B1 * | 7/2002 | Gollomp | ................. | B60L 58/12 |
| | | | | 324/426 |

| | | | | |
|---|---|---|---|---|
| 8,000,842 B2 * | 8/2011 | Yi | ..................... | H04L 12/40039 |
| | | | | 701/32.7 |
| 8,209,082 B2 * | 6/2012 | Miller | .................. | G01R 31/382 |
| | | | | 701/33.3 |
| 9,884,557 B2 | 2/2018 | Park | | |
| 10,093,197 B2 | 10/2018 | Deljevic et al. | | |
| 10,363,796 B2 | 7/2019 | DeCia et al. | | |
| 10,401,937 B2 * | 9/2019 | Darin | ................... | G07C 5/0816 |
| 10,606,256 B2 * | 3/2020 | Halonen | ............. | G07C 5/0808 |
| 11,308,740 B2 * | 4/2022 | Pofahl | .................... | G07C 5/085 |
| 11,554,731 B2 | 1/2023 | Chen et al. | | |
| 2012/0075763 A1 * | 3/2012 | Sieber | ................ | F02N 11/0862 |
| | | | | 361/93.9 |
| 2013/0141040 A1 * | 6/2013 | DeBoer | ................... | B60L 53/62 |
| | | | | 320/109 |
| 2014/0274223 A1 | 9/2014 | Kleve et al. | | |

(Continued)

*Primary Examiner* — Zhen Y Wu

(74) *Attorney, Agent, or Firm* — Frank Lollo; Eversheds Sutherland (US) LLP

(57) ABSTRACT

Current limits are set for detecting anomalous current drain of a battery in an electrical system during a Key-Off state of a vehicle. A plurality of test vehicles are selected which are operational without any anomalous current drain. A plurality of time intervals are identified according to a plurality of predetermined Key-Off-Load (KOL) modes which are activated successively after initiation of the Key-Off state. Key-Off interval currents are measured during each of the time intervals in each of the test vehicles. A respective average current of the interval currents is determined in each respective time interval. A respective standard-deviation current of the interval currents is determined in each respective time interval. A respective current limit is set corresponding to each time interval according to the respective average current plus a respective incremental value determined according to the respective standard-deviation current.

14 Claims, 5 Drawing Sheets

(56)　　　　　　References Cited

U.S. PATENT DOCUMENTS

| | | | |
|---|---|---|---|
| 2016/0089999 A1* | 3/2016 | Tabatowski-Bush | ........................ H02J 7/0016 320/136 |
| 2018/0236890 A1* | 8/2018 | Cyrne | ........................ B60L 3/12 |
| 2019/0310623 A1* | 10/2019 | Halonen | .............. G05D 1/0011 |
| 2019/0379218 A1* | 12/2019 | Varughese | ............ B60R 16/033 |
| 2021/0248843 A1* | 8/2021 | Suzuki | .................. B60W 40/08 |
| 2023/0294620 A1* | 9/2023 | Lowe | .................... B60R 16/033 701/29.2 |
| 2023/0298395 A1* | 9/2023 | Yi | ......................... G07C 5/008 701/29.3 |

* cited by examiner

42 — Select Nominal Vehicles

43 — Define Time Intervals

44 — Measure Key-Off Current In Each Time Interval In Each Vehicle

45 — Calculate Mean And Standard Deviation Of Each Interval Over All Vehicles

46 — Input Calculated Values Into Vehicles To Be Monitored

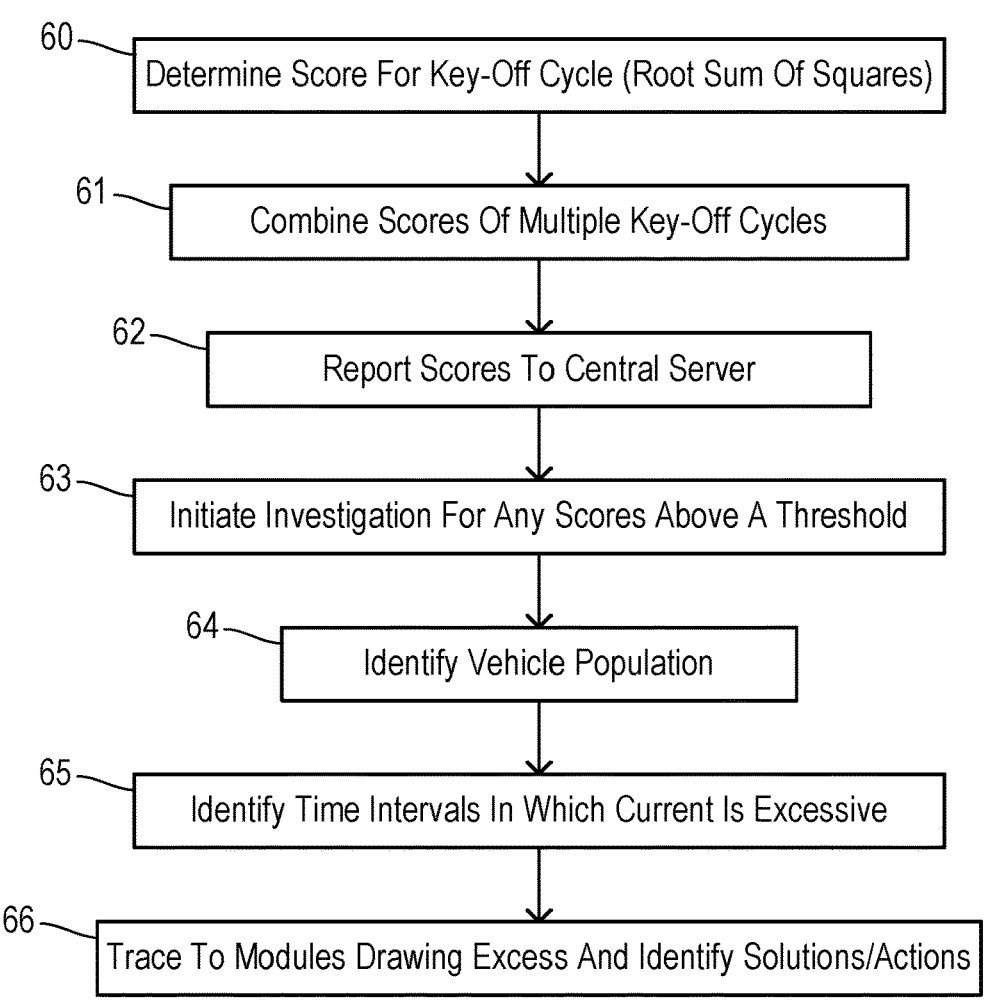

60 — Determine Score For Key-Off Cycle (Root Sum Of Squares)

61 — Combine Scores Of Multiple Key-Off Cycles

62 — Report Scores To Central Server

63 — Initiate Investigation For Any Scores Above A Threshold

64 — Identify Vehicle Population

65 — Identify Time Intervals In Which Current Is Excessive

66 — Trace To Modules Drawing Excess And Identify Solutions/Actions

Fig. 8

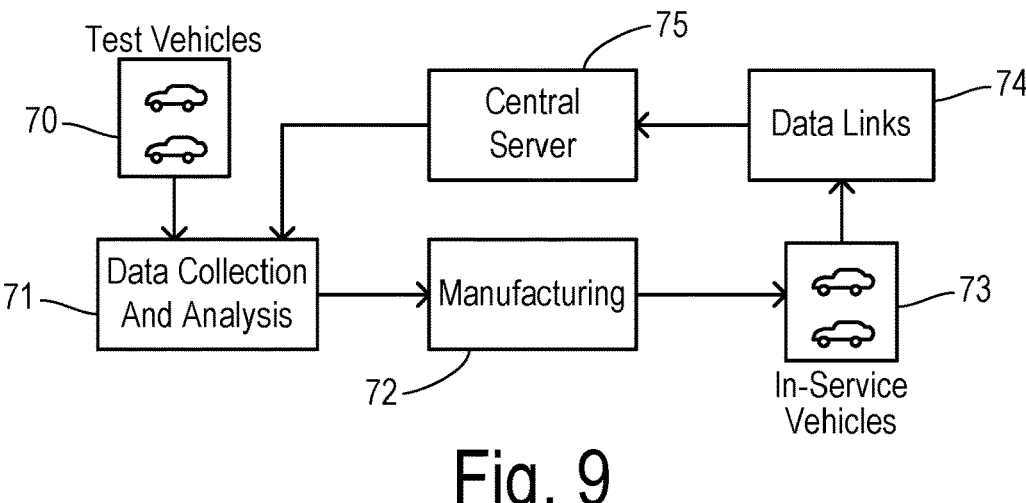

Test Vehicles

70 —

75 — Central Server

74 — Data Links

71 — Data Collection And Analysis

72 — Manufacturing

73 — In-Service Vehicles

Fig. 9

VEHICLE KEY-OFF LOAD MONITORING

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to battery power management in an automotive vehicle, and, more specifically, to monitoring battery power management in and among a plurality of vehicles for identifying performance anomalies and/or identifying actions for protecting battery reserves.

A typical automotive electrical system relies on a storage battery to power electrical system loads during times when a main electrical power source is inactive/inaccessible. In a gas-powered vehicle, the main electrical power source typically includes an alternator/generator driven by an internal combustion engine (which is started by a starter motor that is also powered by the storage battery). In an electric propulsion vehicle, the main electrical power source typically includes a high voltage/high capacity battery pack (also known as a high-voltage traction battery). Typically, the high voltage battery for vehicle propulsion supplies up to several hundred volts and has a capability of multiple-tens or hundreds of kilowatts-hour energy storage. The electric vehicle will also typically utilize a low-voltage storage battery which is a low-voltage battery, typically a 12 v battery (which may be identical to the storage battery used in a combustion engine vehicle). The storage battery has a finite charge capacity which is much smaller than the high-voltage propulsion battery, and it is important to maintain sufficient energy storage to start up the vehicle (e.g., start the combustion engine or close high voltage contactors to connect a traction battery to electric drive motors).

Many modern electronic vehicle systems operate continuously even when the vehicle is in a parked, unattended state when the storage battery is the only available power source. Examples of electronic modules that must be powered at all times include those that perform functional operations while parked (e.g., antitheft systems and remote entry systems) and those that just need a reduced amount of power to maintain memory contents or to monitor/measure various conditions or electrical communication signals (e.g., while in a sleep mode). Other modules may continue to operate for a specified time after the driver shuts off the vehicle, but can be powered off after the specified time (e.g., courtesy lighting).

Since a vehicle may remain parked for long periods of time, it is important to limit battery drain so that a sufficient battery state-of-charge is still available to activate the vehicle (e.g., to start the engine or close the contactors) when the user returns. Therefore, the vehicle manufacturer specifies limits for the current drawn by various modules under each of the conditions which may arise. In particular, quiescent current limits are set for the modules, wherein the limits apply during times that the vehicle ignition switch has been OFF for a specified time and there has been no user activity. Multiple levels of sleep states (e.g., from a light sleep state to a deep sleep state) may be designated for some modules which progressively decrease the allowable current levels over longer periods of time. For example, a large display screen as part of a driver information system may take an undesirably long time to activate (e.g., boot up) if put into a fully depowered state, thereby forcing the driver to wait to use the device as intended when starting the vehicle. By defining progressive, intermediate current levels for the KOL current of the display unit, a tradeoff between quick availability of a driver information system and the preservation of sufficient battery power for restarting the vehicle can be achieved.

In regard to the consolidated Key-Off-Load management system combining the current drawn by all loads from the storage battery, there may be a first (deepest) KOL Mode referred to as KOL-1 which allows a maximum total quiescent current of no more than 8 milliamps (mA). KOL-1 is typically used only in a newly manufactured vehicle during a vehicle transport mode when it is being delivered to a dealership. A next deepest KOL Mode referred to as KOL-2 may allow a maximum quiescent current of no more than 20 mA. This may be considered to be a normal sleep state in which some modules are still partially powered (e.g., to provide capability of entry keypad detection and other vehicle normal monitoring operations) during the Key Off condition. A KOL-3 Mode may be provided which allows a maximum quiescent current of up to 50 mA in order to allow full activation of some features. For example, luxury vehicles may operate a Welcome function such as welcome lighting based on detection of the approach of the user to the vehicle (e.g., polling to detect a wireless device on the user). A KOL-4 Mode may be provided which allows a maximum quiescent current of up to 500 mA. This higher level of current draw may be used to keep large display panels or other ECU and computerized systems partially powered during vehicle sleep to provide for a quick bootup (e.g., a few seconds instead of 30 seconds or more for a depowered display system). Even with enhanced storage battery capacities, a KOL-4 Mode can typically be maintained for only about 14 to 24 hours. It should be noted that not all four of the above modes would necessarily be implemented in any particular vehicle, and a fewer number of modes can be used. For example, the KOL-3 Mode and KOL-4 Mode as described above may be combined into a single mode (i.e., a Welcome function and fast-bootup mode of a display system can be controlled together). Furthermore, the KOL modes may be subsets of one another, such that a higher mode may activate certain loads at a higher current draw but any loads other than the ones specifically modified for that mode continue to operate as defined at the lower modes.

The setting of maximum total quiescent current values depends on an interplay of the electrical needs of various modules for providing desired features at the appropriate times with the need to maintain battery charge levels for the needed periods of time. Because of the complexities of device interactions and a large number of contingencies in both the current drawn by the loads and the storage capacity of individual batteries, the determination of quiescent current limits for detecting excessive current depletion during Key Off has been time consuming and resource intensive. Furthermore, the tracking and evaluation of vehicle KOL performance for fleets of vehicles has been difficult and imprecise.

Attempts by vehicle manufacturers to proactively identify potential issues involving Key-Off Load performance by projecting trends in detections of events in which excessive KOL current drain occurs have been hampered by a lack of meaningful metrics. It would be desirable to enable better recognition of KOL performance issues and improved diagnosis of the cause of such performance issues. Manufacturers want to monitor such trends because excessive current drain can cause battery wear which leads to warranty costs and dissatisfaction.

SUMMARY OF THE INVENTION

In one aspect of the invention, a method of setting current limits for detecting anomalous current drain of a battery in an electrical system during a Key-Off state of a vehicle is comprised of selecting a plurality of test vehicles which are operational without any anomalous current drain. A plurality of time intervals are identified according to a plurality of predetermined Key-Off-Load (KOL) modes which are activated successively after initiation of the Key-Off state. Key-Off interval currents are measured during each of the time intervals in each of the test vehicles. A respective average current of the interval currents is determined in each respective time interval. A respective standard-deviation current of the interval currents is determined in each respective time interval. A respective current limit is set corresponding to each time interval according to the respective average current plus a respective incremental value determined according to the respective standard-deviation current.

A Key-On or a Key-Off state as used herein refers to activated and deactivated vehicle states which are controlled not only using a physical key and lock but also controlled using a push button switch, keypad, voice commands, or wireless devices such as a key fob or a smartphone having a Phone-as-a-Key (PaaK) application.

BRIEF DESCRIPTION OF THE DRAWINGS

FIG. 8 is a flowchart showing a method for monitoring a fleet of purchased vehicles.

FIG. 9 is a block diagram showing a system for monitoring the fleet of vehicles.

DETAILED DESCRIPTION OF PREFERRED EMBODIMENTS

Figure 1:
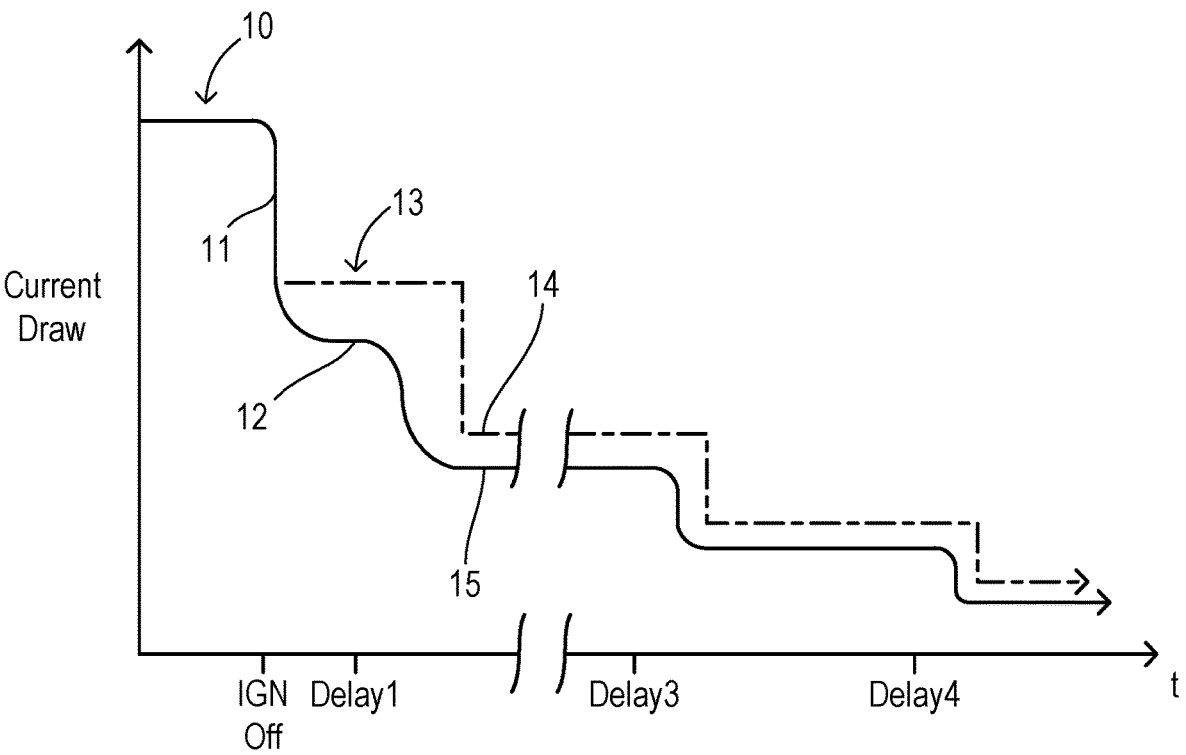
FIG. 1 is a graph showing current draw limits for different KOL modes compared with actual current draw during a Key-Off state.

FIG. 1 shows variation of the current drawn from a storage battery by the combined electrical loads over a span of time during which a main electrical power is unavailable (i.e., the vehicle is in a Key-Off state). A trace 10 depicts the total current draw from the storage battery which follows a stepwise drop beginning with an ignition key being turned off (IGN Off) causing trace 10 to drop at 11 to a reduced level 12 during a first Key-Off mode. Current draw 12 occurs during a time period (from IGN Off to a first delay time Delay1) which is known as an Accessory Delay. During Accessory Delay, several systems and modules continue to operate in order to temporarily assist the occupants (e.g., courtesy lighting, active powerpoints, and powered window operation). During the Accessory Delay, active systems may continue to draw current from the battery to operate various devices according to time periods and capabilities determined within the individual systems. For purposes of detecting an undesirably high current draw, a dashed line 13 depicts a maximum current draw that is specified during Accessory Delay. As used herein, "powered down state" includes both 1) a sleep state when a module suspends most activities but still uses a small amount of power to monitor for a wake-up signal, and 2) a fully off condition.

At a subsequent time shown as Delay1, a power management controller determines that a global Accessory Delay period has expired. The Accessory Delay period may be a predetermined length of time after IGN Off or may also depend upon a moment at which the occupants are detected to be exiting the vehicle. At Delay1, many functions are disabled and the expected current draw drops below a level indicated at 15 as some systems/modules are powered down. After that time, a new KOL mode begins during which the aggregate battery drain is expected to be below a current limit 14. At subsequent times Delay3 and Delay4, other KOL modes begin during which additional systems/modules are shut down and more stringent current limits are imposed.

Figure 2:
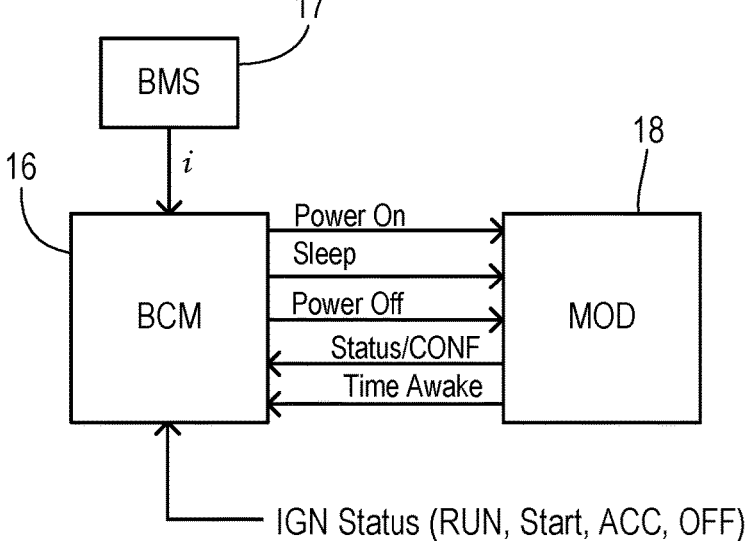
FIG. 2 is a block diagram showing interaction of a power management module and a controller module.

FIG. 2 shows portions of a vehicle electrical system involved in Key-Off load management. A body control module (BCM) 16 is configured (e.g., via software and/or firmware programming) to implement a Key-Off load management strategy in response to vehicle ignition status which is determined in response to data messages from a multiplex bus. BCM 16 is coupled to a battery monitoring system (BMS) 17 which is connected to a storage battery (not shown). An electronic controller module 18 represents any electronic module (e.g., lighting module, HVAC module, audio entertainment module, or wireless communications module) which receives power from the storage battery during a Key-Off state and may have several different power modes which may be supervised by BCM 16. BCM 16 receives a measured current i from BMS 17. BCM 16 exchanges various control and data signals with representative controller module 18, such as commands for powering on, entering a sleep mode, and initiating a power off state. Module 18 may transmit various reply signals to BCM 16 such as a status/confirmation signal, and a data message identifying a duration of time that module 18 has continuously remained awake.

Figure 3:
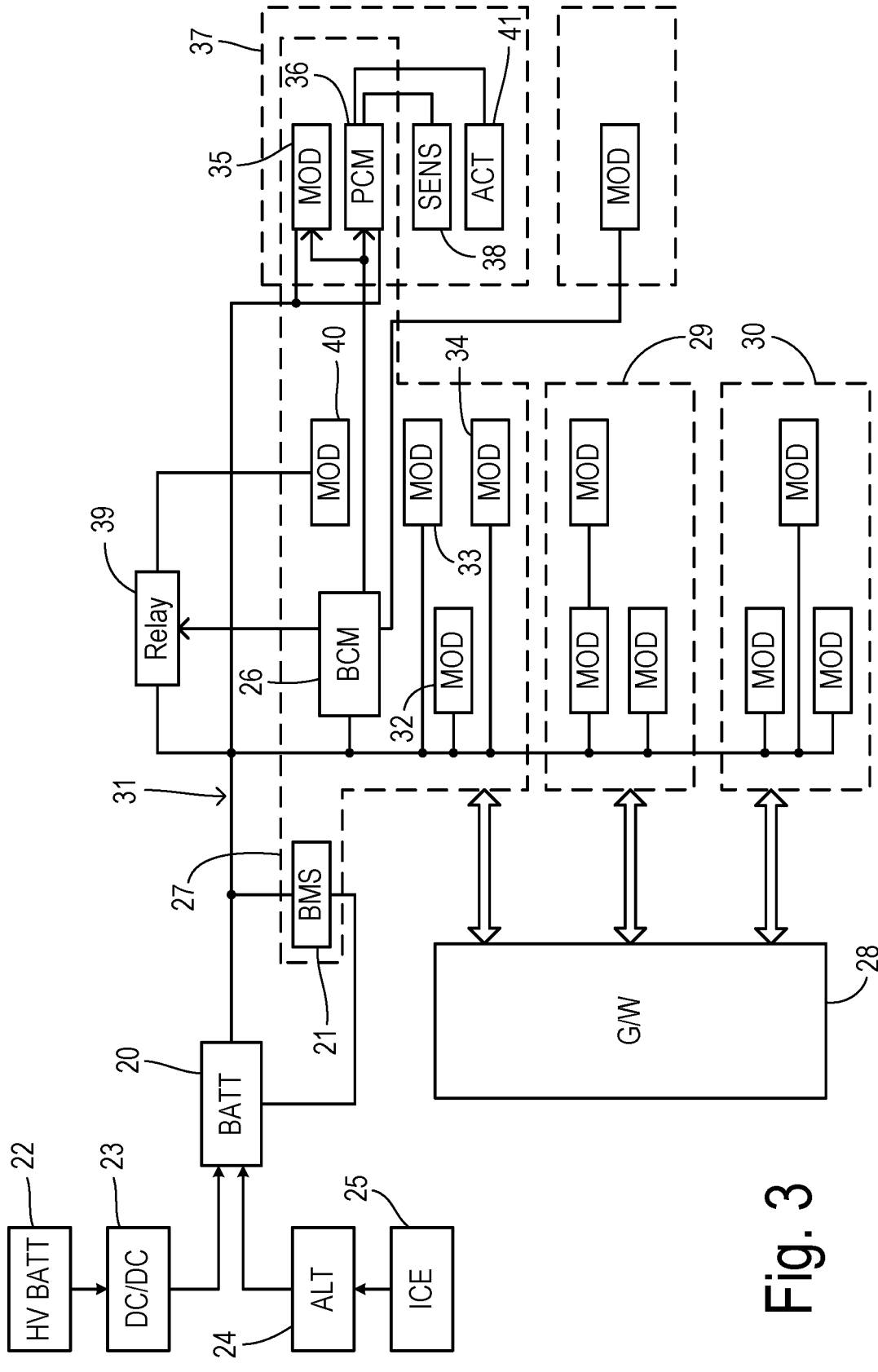
FIG. 3 is a block diagram showing one embodiment of an electrical architecture for distributing electrical power and multiplex communication signals in which KOL power management is implemented.

FIG. 3 shows a more complete electrical architecture with a storage battery 20 connected to a battery monitoring system (BMS) 21. BMS 21 may be a conventional component which, among other things, measures battery current flow passing from battery 20 to the electrical loads. When part of an electric propulsion vehicle, low-voltage storage battery 20 may be recharged from a high-voltage battery pack 22 via a DC-to-DC converter 23. When included in a gas propulsion vehicle or a hybrid vehicle, storage battery 20 may be recharged by an alternator 24 driven by an internal combustion engine 25.

A body control module (BCM) 26 and BMS 21 are both contained within and communicate over a bus network (not shown), such as a CAN bus which links the electronic modules within a grouping 27. The bus network for grouping 27 interconnects with a gateway 28 which further connects with additional bus network groups 29 and 30 which may operate using different protocols. Gateway 28 re-formats and passes messages between networks so that modules in different bus networks can exchange communication signals as known in the art. A power bus 31 distributes an output of battery 20 to various modules including BCM 26 and many other modules, including a set of modules 32-34 which are interconnected in bus group 27.

Also interconnected within bus group 27 are a module 35 and a powertrain control module (PCM) 36. Power to modules 35 and 36 is controlled by BCM 26 as a sub-net 37 (e.g., they have their power managed by BCM 26 as one unit). Modules 35 and 36 receive a supply voltage directly via power bus 31, but each receives shared control signals from BCM 26 in order to activate or deactivate power to modules 35 and 36 simultaneously. Control messages from BCM 26 may further include commands which control power delivery to subordinate components of a control module, such as sensors 38 and actuators 41 which receive power through PCM 36.

In another example of power management, BCM 26 is connected to a relay 39 which receives power from power bus 31 and selectably transmits power to a module 40. Relay 39 can, for example, be comprised of an ignition relay. Module 40 is further connected with bus grouping 27. Relay 39 may be controlled by a direct signal connection with BCM 26 or alternatively via a multiplex message. However, rather than having a sleep mode, module 40 is either fully powered or fully depowered according to the ON/OFF state of relay 39. On the other hand, modules 35 and 36 are powered at all times from power bus 31, but each invokes a respective reduced-power mode such as a sleep state.

By virtue of the interconnections shown in FIG. 3, BCM 26 can respond to vehicle states to operate various loads (e.g., modules) at selected power levels (KOL modes) according to a Key-Off schedule and then obtaining measured an aggregated Key-Off current flowing from the storage battery during each of the Key-Off time intervals. When a measured Key-Off current is greater than a prescribed limit then BCM 26 can record the event for diagnostic purposes and may take corrective action to preserve the charge of the storage battery.

The present invention is directed to the selection of appropriate current limits and the monitoring of conformance with the current limits by a fleet of vehicles. A key-off load metric is derived which can better identify when and why key-off load issues occur, enabling prediction and prevention of excessive key-off load drains. The metric follows a timewise profile of acceptable current draw from the battery (e.g., according to time intervals according to the elapsed time since the ignition key was turned off). An example profile has seven time intervals. The metric may provide an overall score that can be used to rate the performance of (A) an individual key-off cycle of one vehicle, (B) all key-off cycles for an individual vehicle, (C) all key-off cycles in a given week for a given vehicle program or model, or (D) any other combination of key-off cycles of interest.

When the vehicle is turned off, there are different processes that occur (e.g., via messaging on the CAN bus) while the vehicle is shutting down. Some modules turn off within a few minutes, while others are permitted to draw current for a longer period of time. Based on the shutdown pattern, a profile may define an acceptable current draw for each respective time interval. To develop the profile, a representative sample of vehicles having error-free performance (i.e., nominal test vehicles) is identified. For these well-performing vehicles having no known key-off load issues, a history of current drawn during a plurality of key-off cycles are gathered in a process to determine the target currents. Within each time interval of a key-off cycle, an average current is measured. The average current may be comprised of a mean value ($\mu$) of periodic current measurements during the interval. Averages currents are obtained during each of the seven time intervals. In one example, the time intervals were 0-6 minutes, 6-12 minutes, 12-30 minutes, 30-60 minutes, 60-90 minutes, 90 minutes to 3 hours, and more than 3 hours. A standard deviation ($\sigma$) of the measured current during each time interval is also determined (using known statistical methods).

According to some embodiments, if a measured (average) interval current (i) for a single time interval is less than one standard deviation above the mean ($\mu+\sigma$) then the vehicle is in a green zone for that time interval. If a measured interval current is between one and two standard deviations above the mean [i.e., $(\mu+\sigma) \leq i < (\rho+2\sigma)$], then it is in a yellow zone. If the measured interval current is greater than two standard deviations above the mean [i.e., $i > (\rho+2\sigma)$], it is in a red zone. In order to score an entire key-off cycle, a "root sum of squares" scoring method compares the actual vehicle currents during each respective time interval to a normalized acceptable score that uses standard error to account for the sample size. Thus, the more key-off cycles used for scoring, the closer the averaged currents from the in-service vehicles will be to the previously derived target currents (which were developed from the ideal/well-performing vehicles).

Using this scoring system, if a group of key-off cycles has a final score of less than or equal to 1 then it is performing as expected (i.e., would pass). If a group of key-off cycles scores greater than 1, then it is drawing more current than allowed, and more attention should be given to these vehicles.

Figure 4:
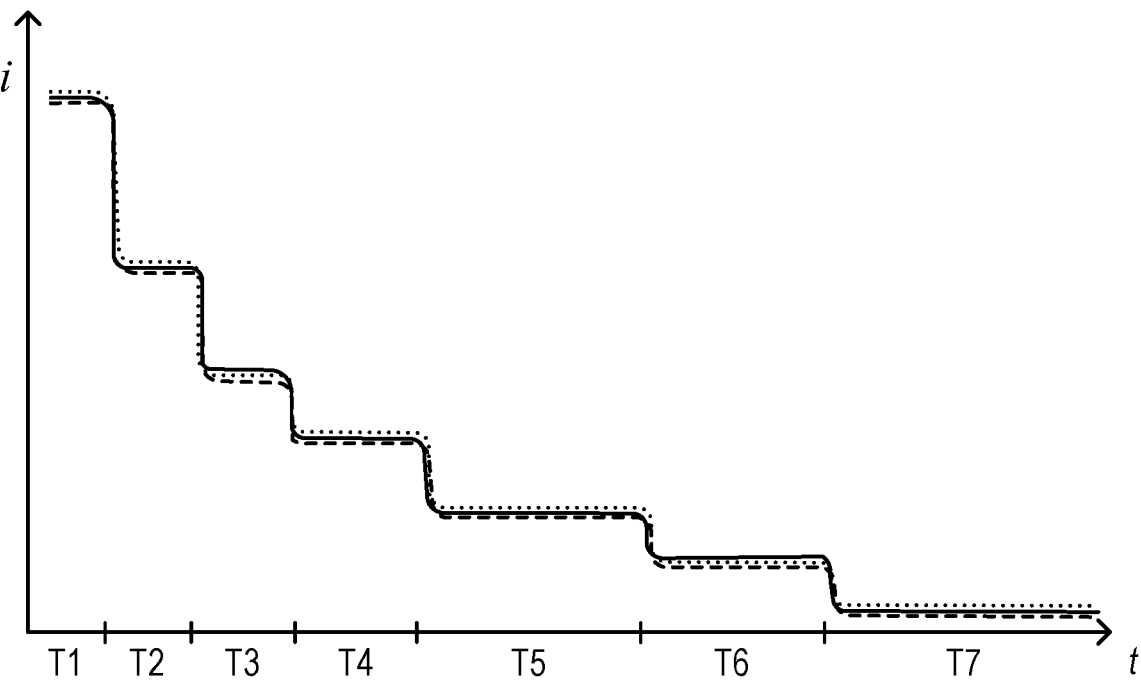
FIG. 4 is a graph showing measured current draw from a plurality of test vehicles during a Key-Off state.
Figure 5:
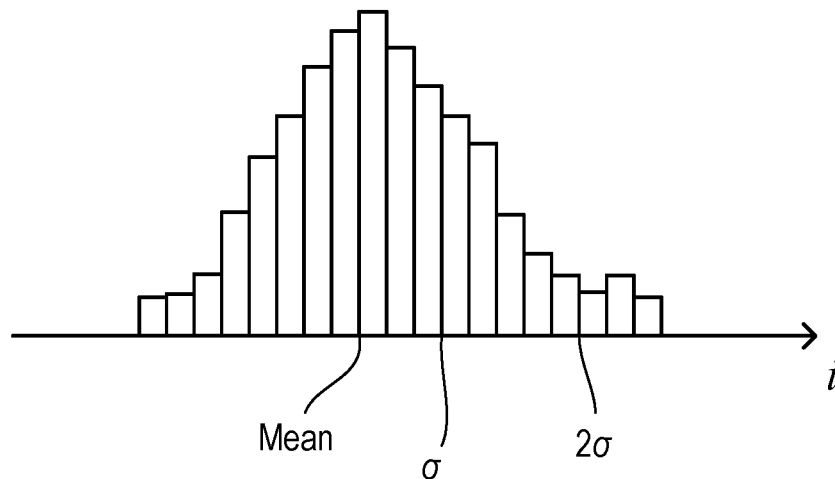
FIG. 5 is a data distribution of measured currents during an example time interval of the test vehicles.

FIG. 4 shows key-off load current draw for a plurality of test vehicles. A Key-Off state of a vehicle is divided into seven time intervals designated T1 through T7. At the beginning of each time interval, a particular set of electrical loads (e.g., modules) becomes inhibited so that the total aggregate current drops accordingly. The solid line, dashed line, and dotted line each represents a Key-Off interval current draw for a respective one of the test vehicles. Since the current draw in any particular vehicle may not be constant, a measured current for an interval may be comprised of an average current during the interval, for example. Multiple key-off cycles may be characterized for each of a plurality of test vehicles, and the resulting data may be analyzed as shown in FIG. 5 to determine an average current for each respective interval as well as a standard deviation of the current values in the sample. In FIG. 5, each vertical bar shows the number of occurrences of each current value in the sample. An arithmetic mean is shown along with one standard deviation ($\sigma$) and two standard deviations ($2\sigma$). Based on the data from the well-performing vehicles, a current limit may be set at an appropriate level above the mean. For example, a current limit may be set at the mean plus two times the standard deviation.

Figure 6:
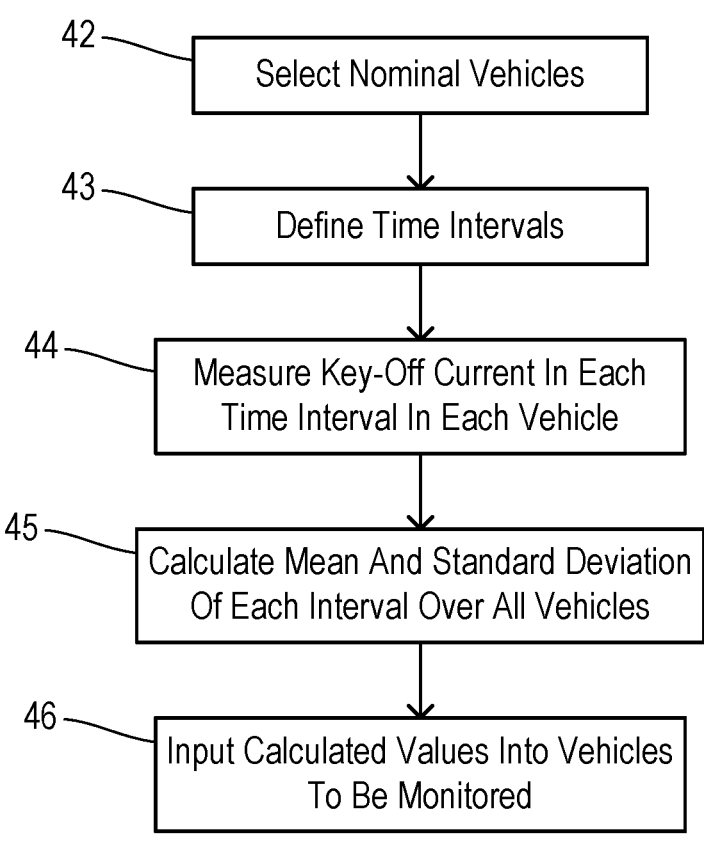
FIG. 6 is a flowchart showing a process for determining current limits to detect excessive current draw in purchased vehicles.

One preferred method for deriving current limits is summarized in FIG. 6. A plurality of nominal test vehicles are selected in step 42. Test vehicles are selected which are known to operate without any anomalous current drain during the Key-Off state. In particular, the test vehicles may include prototype vehicles and/or early production vehicles. Based on the Key-Off Load (KOL) Modes utilized in the test vehicles, a plurality of time intervals are defined in step 43 for monitoring the KOL current draw. The time intervals may each have starting and ending times measured in respective elapsed times since entering the Key-Off state.

In step 44, KOL performance data is collected for multiple Key-Off cycles of each of the test vehicles. More specifically, a Key-Off current is measured in each time interval in each test vehicle. Preferably, a single current value is derived for each individual time interval, wherein the single value may be comprised of (1) an average of the current drain over the time interval, (2) a maximum current drain during the time interval, or (3) any other representative current value. Using the measured Key-Off interval currents, an average value (e.g., mean value) and a standard deviation of all the measured values are determined for each respective time interval in step 45.

A current limit to be utilized for each respective time interval is derived based on the mean value ($\mu$) and the standard deviation ($\sigma$). When monitoring vehicles based on the current limits, measured current drains less than the mean plus the standard deviation ($\mu+\sigma$) would typically be considered to be acceptable. For current drains just above the mean plus the standard deviation, a slight chance of excessive drain may be present, and a "Yellow" condition may be recognized. Measured current drains above an even higher threshold may indicate a "Red" condition which may lead to a higher chance of depleted charge in the storage battery. One preferred value for a higher threshold may be the mean plus two times the standard deviation ($\mu+2\sigma$), for example. The calculated values for p, 6, and any thresholds are loaded into the vehicles to be monitored in step 46. The vehicles to be monitored may be the in-service vehicles which are manufactured for sale or other transfer to customers. As used herein, "purchased vehicles" refers to any vehicles transferred to a customer whether by sale, lease, or otherwise.

Figure 7:
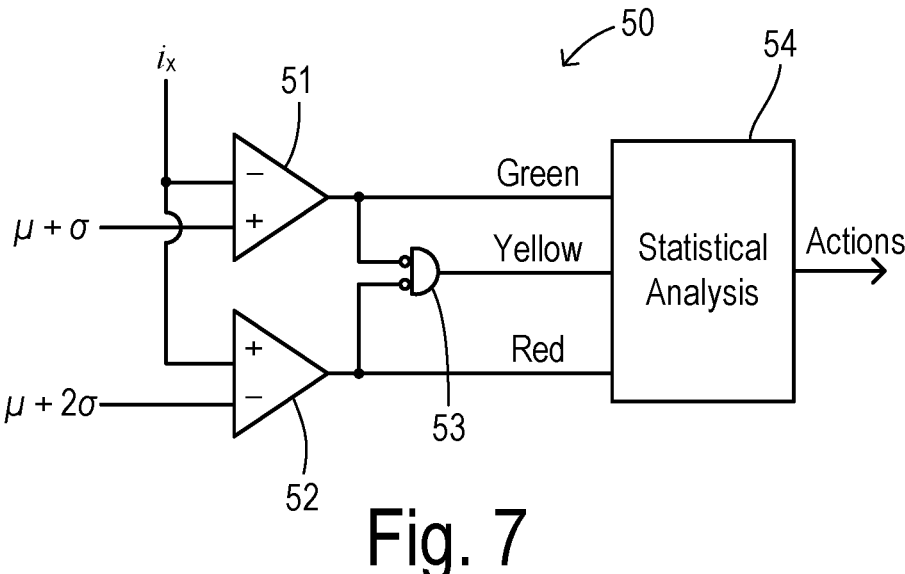
FIG. 7 is a block diagram showing one embodiment of a circuit for detecting and responding to excessive KOL current in a vehicle.

The current limits as derived herein may be utilized by the purchased vehicle for onboard monitoring so that excessive KOL current drain can be detected and remedied. FIG. 7 shows a monitoring circuit 50 wherein a measured current $i_x$ for a time interval x is coupled to an inverting input of a comparator 51 and to a noninverting input of a comparator 52. A first threshold (e.g., $\mu+\sigma$) is coupled to the noninverting input of comparator 51. A second threshold (e.g., $\mu+2\sigma$) is coupled to the inverting input of comparator 52. The outputs of comparators 51 and 52 are coupled to a statistical analysis unit 54. When the value of current $i_x$ is less than the first threshold then the output of comparator 51 goes high (a logical 1) to indicate a Green condition (i.e., no excessive drain). Simultaneously, the output of comparator 52 is low (logical 0) since current $i_x$ is also less than the second threshold. Statistical analysis unit 54 is configured to take no action in response to the Green condition.

The outputs of comparators 51 and 52 are each coupled to a respective inverting input of an AND gate 53 which has its output coupled to statistical analysis unit 54. When the value of current $i_x$ becomes greater than the first threshold and less than the second threshold then the low outputs from comparators 51 and 52 are inverted at the input of AND gate 53 so that the output of AND gate 53 goes high to indicate a Yellow condition. When the value of current $i_x$ is greater than the second threshold then the output of comparator 52 goes high to indicate a Red condition (i.e., excessive drain). Statistical analysis unit 54 is configured to monitor the Yellow and Red conditions over time to determine appropriate actions to mitigate the excessive KOL current drains (e.g., driver notification and/or altering the permitted loads during respective time intervals).

The current limits as derived herein may be utilized by the purchased vehicle for detecting KOL conditions during which data on excessive KOL current drain should be reported offboard the vehicle in order to facilitate monitoring of a fleet of vehicles to which the purchased vehicle belongs (e.g., all vehicles of a particular model of car or truck). Once a purchased, in-service vehicle is operated based on the current limits as described above, a method as shown in FIG. 8 can be utilized for monitoring such fleet of vehicles. In step 60, each vehicle determines a score in step 60 for each Key-Off cycle. The score may be based on an examination of an aggregation of all the discrepancies between respective current limits and the actual current consumption during the respective time intervals. For example, a root sum of squares which is normalized according to a standard error may be used to calculate a score value for a Key-Off cycle in each individual vehicle. In step 61, the scores obtained from multiple cycles are combined (e.g., collected into a data package and/or further processed to characterize the performance of the individual vehicle). For example, a score for a time interval may be comprised of a number reflecting how many standard deviations the actual current is above the current limit. A score of 1 or below would be indicative of no issues. A score above 1 may be sufficient to initiate reporting or other action. In step 62, each individual vehicle reports the scores by transmitting the data package to a central server. A manufacturer may maintain a central server in a network which is accessible to the fleet of vehicles by wireless communication such as a cellular data connection, for example.

The received scores are collected an analyzed by the manufacturer using the central server. In step 63, the manufacturer may initiate an investigation when a particular number of the scores or some combination of scores exceeds a threshold (i.e., an abnormality is detected). When scores exceeding the threshold are present, an identification of the particular population of vehicles is performed in step 64 (e.g., vehicle models and/or trim levels of a particular model). In step 65, the scores and any supporting data are analyzed to determine which time intervals are impacted by excessive current drain. Based on the modules known to be active during various time intervals, the identity or identities of modules that may be responsible for the excessive current drain can be traced in step 66. Based on the source of excessive current drain, a solution or other responsive actions can be identified and undertaken by the manufacturer.

The reported scores can also be utilized to track the progress of a vehicle fleet over time to see if it improves as a result of actions taken. When particular vehicles score above a 1 at some point in time, data can be reviewed in a more granular fashion to identify in which vehicles an issue is occurring and when in the KOL shutdown process it is occurring. Once the manufacturer knows when in the shutdown process an excess drain is occurring, it can attempt to replicate the issue in engineering vehicles and identify a fix.

FIG. 9 shows a schematic diagram of an overall implementation of the invention in which test vehicles 70 without any anomalous current drain are operated and from which actual current drain data is collected by recording the data during Key-Off trials. An engineering function 71 performed the data collection and analyzes the data to generate respective current limits to be used in vehicle production, and the current limits are utilized in a manufacturing process 72 which produces in-service vehicles 73. During normal operation, vehicles 73 monitor the Key-Off load scores and, when appropriate, the scores are combined and transferred over data links 74 to a central server 75. Data from central server 75 is utilized by engineering function 71 as described above.

What is claimed is:

1. A method of setting current limits for detecting anomalous current drain of a battery in an electrical system during a Key-Off state of a vehicle, the method comprising the steps of:

selecting a plurality of test vehicles which are operational without any anomalous current drain;

identifying a plurality of time intervals according to a plurality of predetermined Key-Off-Load (KOL) modes which are activated successively after initiation of the Key-Off state;

measuring Key-Off interval currents during each of the time intervals in each of the test vehicles;

determining a respective average current of the interval currents in each respective time interval;

determining a respective standard-deviation current of the interval currents in each respective time interval; and setting a respective current limit corresponding to each time interval according to the respective average current plus a respective incremental value determined according to the respective standard-deviation current.

2. The method of claim 1 wherein each respective average current is comprised of a mean value of the respective interval currents of each respective time interval.

3. The method of claim 1 wherein each respective incremental value is comprised of two times the respective standard-deviation current.

4. The method of claim 1 further comprising the steps of:

measuring Key-Off interval currents during each of the time intervals in a purchased vehicle not included in the plurality of test vehicles;

comparing the measured Key-Off interval currents to respective current limits; and detecting an excessive current drain when one of the measured Key-Off interval currents is greater than the respective current limit.

5. A method of monitoring a fleet of vehicles for excessive Key-Off Load (KOL) current drain while in a Key-Off state, the method comprising the steps of:

selecting a plurality of test vehicles which are operational without any anomalous current drain;

identifying a plurality of time intervals according to a plurality of predetermined KOL modes which are activated successively after initiation of the Key-Off state;

measuring Key-Off interval currents during each of the time intervals in each of the test vehicles;

determining a respective average current of the interval currents in each respective time interval;

determining a respective standard-deviation current of the interval currents in each respective time interval;

setting a respective current limit corresponding to each time interval according to the respective average current plus a respective incremental value determined according to the respective standard-deviation current;

transferring the respective current limits to each vehicle of the fleet of vehicles;

measuring Key-Off interval currents during each of the time intervals in each of the vehicles in the fleet of vehicles;

comparing the measured Key-Off interval currents to the respective current limits to determine respective Key-Off load scores for each vehicle of the fleet of vehicles;

combining Key-Off load scores from the fleet of vehicles; and detecting an abnormality of the vehicles in the fleet of vehicles when the combined Key-Off load scores exceed a predetermined threshold.

6. The method of claim 5 wherein each respective average current is comprised of a mean value of the respective interval currents of each respective time interval.

7. The method of claim 5 wherein each respective incremental value is comprised of two times the respective standard-deviation current.

8. The method of claim 5 wherein each respective Key-Off load score is comprised of a root sum of squares taken of each of differences between respective measured Key-Off interval currents and respective current limits.

9. The method of claim 5 wherein each time interval is associated with a respective first current limit and a respective second current limit, and wherein each respective Key-Off load score is determined according to a compilation of respective time intervals in which the respective measured Key-Off interval current is greater than the respective first current limit and in which the respective measured Key-Off interval current is greater than the respective second current limit.

10. The method of claim 9 wherein each first current limit is comprised of the respective average current plus the respective standard-deviation current, and wherein each second current limit is comprised of the respective average current plus two times the respective standard-deviation current.

11. The method of claim 5 further comprising the step of:

when the abnormality is detected, then matching the time intervals and measured Key-Off interval currents to electronic modules in the fleet of vehicles capable of malfunctioning to create the measured Key-Off interval currents.

12. A vehicle comprising:

a battery configured to supply electrical current during a Key-Off state of the vehicle;

a plurality of electrical loads each configurable to receive the electrical current flowing from the battery during the Key-Off state depending upon predetermined Key-Off-Load (KOL) Modes active according to respective time intervals;

a battery monitor measuring Key-Off interval currents during each of the time intervals;

a controller configured to (1) compare the measured Key-Off interval currents to respective current limits, and (2) indicate an excessive current drain in response to one of the measured Key-Off interval currents being greater than the respective current limit;

wherein the respective current limits are obtained from:

selecting a plurality of test vehicles which are operational without any anomalous current drain;

measuring Key-Off interval currents during each of the time intervals in each of the test vehicles;

determining a respective average current of the interval currents in each respective time interval;

determining a respective standard-deviation current of the interval currents in each respective time interval; and setting a respective current limit corresponding to each time interval according to the respective average current plus a respective incremental value determined according to the respective standard-deviation current.

13. The vehicle of claim 12 wherein each respective average current is comprised of a mean value of the respective Key-Off interval currents of each respective time interval.

14. The vehicle of claim 12 wherein each respective incremental value is comprised of two times the respective standard-deviation current.

* * * * *